United States Patent

Kabumoto et al.

[11] Patent Number: 5,883,428
[45] Date of Patent: Mar. 16, 1999

[54] PACKAGE FOR HOUSING A SEMICONDUCTOR ELEMENT

[75] Inventors: Masanao Kabumoto; Masaaki Hori; Tetsuo Hirakawa, all of Kokubu, Japan

[73] Assignee: Kyocera Corporation, Kyoto, Japan

[21] Appl. No.: 893,138

[22] Filed: Jul. 15, 1997

Related U.S. Application Data

[63] Continuation of Ser. No. 667,985, Jun. 19, 1996, abandoned.

[30] Foreign Application Priority Data

Jun. 19, 1995 [JP] Japan ................................. 7-151834

[51] Int. Cl.$^6$ .......................... H01L 29/00; H01L 23/52; H01L 23/48
[52] U.S. Cl. ..................... 257/691; 257/532; 257/689; 257/693
[58] Field of Search .................... 257/684, 688, 257/689, 691, 693, 532

[56] References Cited

U.S. PATENT DOCUMENTS

| | | | |
|---|---|---|---|
| 4,835,344 | 5/1989 | Iyogi et al. | 174/68.5 |
| 5,370,907 | 12/1994 | Yamakawa et al. | 427/376.3 |
| 5,371,403 | 12/1994 | Huang et al. | 257/691 |
| 5,394,008 | 2/1995 | Ito et al. | 257/666 |
| 5,399,902 | 3/1995 | Bickford et al. | 257/659 |
| 5,402,318 | 3/1995 | Otsuka et al. | 361/794 |
| 5,468,694 | 11/1995 | Taguchi et al. | 501/77 |

*Primary Examiner*—Mahshid Saadat
*Assistant Examiner*—Allan R. Wilson
*Attorney, Agent, or Firm*—Loeb & Loeb LLP

[57] ABSTRACT

A semiconductor element-housing package, comprising an insulating substrate composed of a plurality of laminated insulating layers and having a mounting portion for mounting a semiconductor element, in the center of a top surface thereof; a ground bonding pad and a power-supply bonding pad formed on the top surface of the insulating substrate, at the periphery of the semiconductor element-mounting portion, to which a ground electrode and a power-supply electrode of the semiconductor element are connected; and a pair of capacitor-connecting pads, formed on the underside of the insulating substrate, one of which is connected to the ground bonding pad, the other of which is connected to the power-supply bonding pad, and to both of which electrodes of a chip capacitor are connected, characterized by having a ground plane and a power-supply plane sandwiching at least one of the insulating layers buried opposing each other within the insulating substrate, and having electrical connections from the ground plane and the power-supply plane to the ground bonding pad and the power-supply bonding pad, respectively, at the periphery of the semiconductor element-mounting portion of the insulating substrate, to thereby downsize the package and to produce a satisfactory, noise-reducing effect.

13 Claims, 1 Drawing Sheet

PACKAGE FOR HOUSING A SEMICONDUCTOR ELEMENT

This is a continuation of application Ser. No. 08/667,985 filed on Jun. 19, 1996, now abandoned.

BACKGROUND OF THE INVENTION

1. Field of the Invention

The present invention relates to a semiconductor element-housing package for mounting a semiconductor element.

2. Description of the Related Art

Conventional semiconductor element-housing packages for mounting semiconductor elements are constructed of an insulating substrate which is composed of a plurality of insulating layers of an electrically insulating material such as sintered aluminum oxide, for example, and which has a mounting portion for mounting a semiconductor element in the center of a top surface thereof; a plurality of metallized wiring layers which lead out from the periphery of the semiconductor element-mounting portion of the insulating substrate to the outer circumference of the top surface of the insulating substrate, and have sections located along the periphery of the semiconductor element-mounting portion to form bonding pads (ground bonding pads, power-supply bonding pads and signal bonding pads) for electrical connections to respective electrodes of the semiconductor element (a ground electrode, power-supply electrode and signal electrode); outer lead pins which are attached, via a brazing material such as brazing silver, to the sections of the metallized wiring layers which have been led to the outer circumference of the top surface of the insulating substrate; and a lid constructed of a metal such as an iron-nickel-cobalt alloy or a ceramic material such as sintered aluminum oxide; a semiconductor device is fabricated as a product by securely bonding the semiconductor element to the semiconductor element-mounting section of the insulating substrate via an adhesive such as a brazing material, resin, glass or the like, electrically connecting the respective electrodes (a ground electrode, power-supply electrode and signal electrode) of the semiconductor element to the counterpart bonding pads (ground bonding pads, power-supply bonding pads and signal bonding pads) via bonding wires, and then bonding the lid to the top surface of the insulating substrate via a sealing material such as solder, a resin, glass or the like to the top surface of the insulating substrate to hermetically seal the semiconductor element inside the container constructed of the insulating substrate and the lid.

Attached to the semiconductor element-housing package is a connecting conductor which is led from the ground bonding pad for an electrical connection to the ground electrode of the semiconductor device, and the power-supply bonding pad for an electrical connection to the power-supply electrode, of the bonding pads mentioned above, to the underside of the insulating substrate, the sections of which led to the underside of the insulating substrate form capacitor-connecting pads for connections to electrodes of a chip capacitor, wherein the chip capacitor is attached to the capacitor-connecting pad via a bonding material such as solder so as to electrically connect the respective electrodes of the chip capacitor to the connecting conductor.

The chip capacitor which is attached to the capacitor-connecting pad functions as a decoupling capacitor to reduce power-supply noise caused by change in electric potential between the ground voltage and the power-supply voltage which are supplied to the semiconductor element; the chip capacitor is designed to ensure normal operation of the semiconductor element by supplying a charge proportional to the change in electric potential between the ground voltage and the power-supply voltage to the ground bonding pad and the power-supply bonding pad which are connected to the ground electrode and the power-supply electrode of the semiconductor element to reduce power-supply noise caused by change in electric potential between the ground voltage and the power-supply voltage.

The chip capacitor, however, has a drawback in that when it is attached to the underside of the insulating substrate, the connecting conductor for establishing electrical connections from the ground bonding pad and the power-supply bonding pad to the capacitor-connecting pad has an increased horizontal length and a large inductance, and this large inductance of the connecting conductor greatly impairs the function of the chip capacitor as a decoupling capacitor, thus preventing full-scale production of the power-supply noise reduction effect of the chip capacitor.

In order to overcome this drawback, it may be advisable to have a plurality of pairs of a ground plane and a power plane placed opposing each other and sandwiching part of the insulating layers which form the insulating substrate, in the insulating substrate to thereby store capacitance between the paired ground planes and power planes, and to establish electrical connections between the ground bonding pad which is electrically connected to the ground electrode of the semiconductor element, and the ground planes, and between the power-supply bonding pad which is electrically connected to the power-supply electrode of the semiconductor element, and the power-supply planes, at the periphery of the semiconductor element-mounting portion, to thereby provide the capacitance as decoupling capacitors.

Here, it is possible to shorten the wires for the electrical connections between the ground planes and the power-supply planes, and the ground bonding pad which is electrically connected to the ground electrode of the semiconductor element, and the power-supply bonding pad which is electrically connected to the power-supply electrode of the semiconductor element, respectively with the result of a small inductance, and eventually to reduce influence of the inductance of the connecting conductor on the noise-reducing effect of the decoupling capacitors.

However, since the specific dielectric constant of the sintered aluminum oxide which composes the insulating substrates of semiconductor element-housing packages is as low as approximately 7, it becomes necessary to have a great number of pairs of ground planes and power-supply planes placed opposing each other and sandwiching part of the insulating layers which form the insulating substrate, or to have vast opposing areas of the paired ground planes and power-supply planes, in order to store sufficiently increased capacitance between the paired ground planes and power-supply planes as decoupling capacitors, and this creates the drawback that extremely thick, large and heavy packages are required for housing a semiconductor element.

SUMMARY OF THE INVENTION

The present invention, which has been made in view of the drawbacks of the prior art mentioned above, is aimed at providing a semiconductor element-housing package which produces a satisfactory, noise-reducing effect without increasing the size and weight of the package.

The present invention relates to a semiconductor element-housing package which comprises:

an insulating substrate composed of a plurality of laminated insulating layers and having a semiconductor element-mounting portion in the center of a top surface thereof;

a ground bonding pad and a power-supply bonding pad formed on the top surface of the insulating substrate, at the periphery of the semiconductor element-mounting portion, to which a ground electrode and a power-supply electrode of the semiconductor element are connected; and a pair of capacitor-connecting pads formed on the underside of the insulating substrate, one of which is connected to the ground bonding pad, the other of which is connected to the power-supply bonding pad, and to both of which electrodes of a chip capacitor are connected, characterized by having a ground plane and a power-supply plane sandwiching at least one of the insulating layers buried opposing each other within the insulating substrate, and having electrical connections from the ground plane and the power-supply plane to the ground bonding pad and the power-supply bonding pad, respectively, at the periphery of the semiconductor element-mounting portion of the insulating substrate.

The present invention is further characterized in that the pair of capacitor-connecting pads are formed in the outer circumference of the underside of the insulating substrate.

The present invention is further characterized in that the insulating substrate comprises sintered aluminum oxide, and the spacing between the ground plane and the power-supply plane is 0.1 mm or less.

The ground plane and the power-supply plane, which are situated close to and opposing each other, and sandwiching the insulating layer in the semiconductor element-housing package according to the invention, have a small inductance due to the-large mutual inductance between the two planes, and as a result, even in cases of large horizontal distances of the capacitor-connecting pads from the ground bonding pad and the power-supply bonding pad connected thereto via the ground plane and the power-supply plane, the inductance between the two bonding pads and the capacitor-connecting pads cannot be large.

In addition, since chip capacitors which function as decoupling capacitors are usually compact while having large capacitances, attachment of the chip capacitor to the insulating substrate does not increase the size and weight of the semiconductor element-housing package.

BRIEF DESCRIPTION OF THE DRAWINGS

Other and further objects, features, and advantages of the invention will be more explicit from the following detailed description taken with reference to the drawings wherein.

DETAILED DESCRIPTION OF THE PREFERRED EMBODIMENTS

Figure 1:
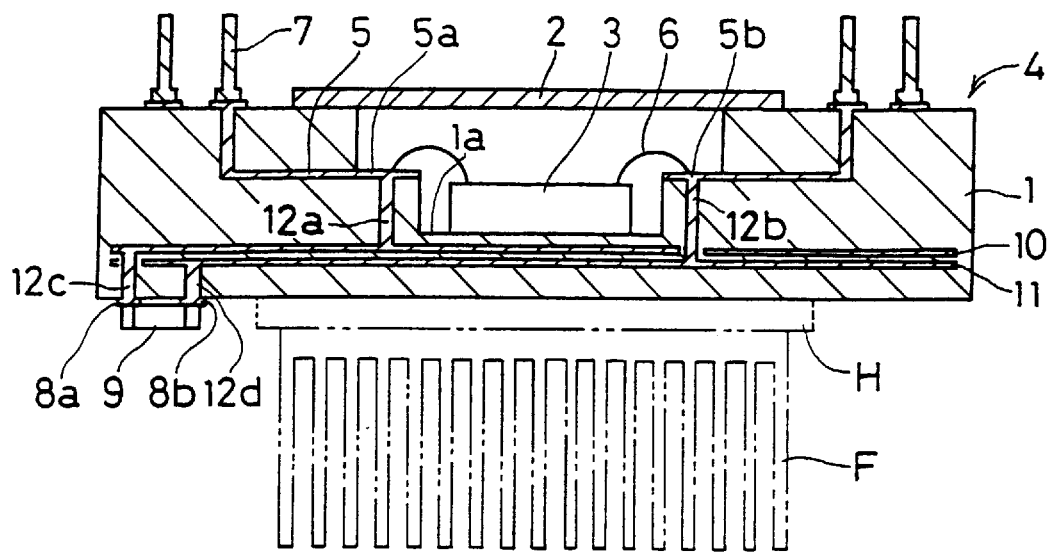
FIG. 1 is a cross sectional view illustrative of an embodiment of the semiconductor element-housing package according to the invention.

Now referring to the drawings, preferred embodiments of the invention are described below.

FIG. 1 illustrates an embodiment of the semiconductor element-housing package according to the invention, wherein 1 is an insulating substrate, and 2 is a lid 2. The insulating substrate 1 and the lid 2 composes an insulated container 4 for housing a semiconductor element 3.

The insulating substrate 1 is integrally formed of a plurality of laminated insulating layers composed of an electrically insulating material such as sintered aluminum oxide, sintered aluminum nitride, sintered mullite, sintered silicon carbide or glass ceramic; a recessed mounting portion 1a for mounting a semiconductor element is formed in the center of the top surface of the insulating substrate 1, and the semiconductor element 3 is securely bonded to the inner bottom surface of the mounting portion 1a via an adhesive such as a brazing material, glass or resin.

The insulating substrate 1 is prepared from, for example, sintered aluminum oxide, by producing a sludge of powder of a raw material such as aluminum oxide, silicon dioxide, magnesium oxide or calcium oxide by addition of an appropriate organic binder, solvent, plasticizer, dispersant or the like, making the sludge into sheets in a conventional manner according to the doctor blade method to provide a plurality of green ceramic sheets, appropriately stamping the green ceramic sheets while laminating them vertically to provide a laminate of the green ceramic sheets, and finally firing the laminate of the green ceramic sheets in a reducing atmosphere at a temperature on the order of 1600° C.

A plurality of metallized wiring layers 5 are formed on the insulating substrate 1 by coating, extending from the periphery of the mounting portion 1a for mounting a semiconductor element to the outer circumference of the top surface of the insulating substrate 1, and sections of each metallized wiring layer 5 which are located in the periphery of the semiconductor element-mounting portion 1a form a ground bonding pad 5a, a power-supply bonding pad 5b and a signal bonding pad (not shown); the electrodes (ground electrode, power-supply electrode and signal electrode) of the semiconductor element 3 are electrically connected to the ground bonding pad 5a, the power-supply bonding pad 5b and the signal bonding pad (not shown), respectively, via bonding wires 6.

The metallized wiring layers 5 function as conducting paths for connecting the respective electrodes (ground electrode, power-supply electrode and signal electrode) of the semiconductor element 3 to outer lead pins 7 described below, and the outer lead pins 7 are attached to sections of the metallized wiring layers S which are led to the top surface of the insulating substrate 1, via a brazing material such as brazing silver.

The metallized wiring layers 5 are composed of a powder of a high-melting point metal such as tungsten, molybdenum or manganese in cases where the insulating substrate 1 is composed of sintered aluminum oxide, sintered aluminum nitride, sintered mullite or sintered silicon carbide, whereas they are composed of a powder of a relatively low-melting point metal such as copper, silver or gold when the insulating substrate 1 is composed of glass ceramic; in cases where they are composed of tungsten, for example, an appropriate organic binder and a solvent are added to tungsten powder, and mixed to prepare tungsten paste which is then print-coated on the green ceramic sheets to be processed into the insulating substrate 1 in a predetermined pattern by the well-known, conventional screen printing method, and then fired together with a laminate of the green ceramic sheets for preparation of the insulating substrate 1 so that the metallized wiring layers 5 are formed by coating, leading from the periphery of the semiconductor element-mounting portion 1a to the outer circumference of the top surface of the insulating substrate 1.

A plurality of outer lead pins 7 made of a metal material such as an iron-nickel-cobalt alloy or iron-nickel alloy are attached to the sections of the metallized wiring layers 5 which are led to the outer circumference of the top surface of the insulating substrate 1, via a brazing material such as brazing silver.

The outer lead pins 7 have the function of connecting the semiconductor element 3 accommodated inside the container 4 to an external electric circuit; it is designed in such a manner that connection of the outer lead pins 7 to wiring conductors of the external electric circuit via a bonding material such as solder establishes an electrical connection between the semiconductor element 3 accommodated inside and the external electric circuit via the bonding wires 6, the metallized wiring layers 5 and the outer lead pins 7.

Formed on the underside of the insulating substrate 1 by coating are capacitor-connecting pads 8a, 8b which are electrically connected to the ground bonding pad 5a which is electrically connected to the ground electrode of the semiconductor element 3, and the power-supply bonding pad 5b which is electrically connected to the power-supply electrode of the semiconductor element 3, via connecting conductors 12a through 12d, a ground plane 10 and a power-supply plane 11 which will be described later; a chip capacitor 9 is attached to the capacitor--connecting pads 8a, 8b via a bonding material such as solder so as to establish electrical connections between the respective electrodes of the chip capacitor 9 and the capacitor-connecting pads 8a, 8b.

The chip capacitor 9 which is attached to the capacitor-connecting pads 8a, 8b via a bonding material such as solder, functions as a decoupling capacitor to reduce power-supply noise which occurs due to change in potential difference between the ground voltage and the power-supply voltage supplied to the semiconductor element 3. Since chip capacitors are usually compact while having large capacitances, the bonding of the chip capacitor 9 to the underside of the insulating substrate 1 does not result in excess increase in the size and weight of the semiconductor element-housing package, and the chip capacitor 9 provides satisfactory capacitance as a decoupling capacitor.

In addition, in cases where the capacitor-connecting pads 8a, 8b are formed on the outer circumference of the underside of the insulating substrate 1 by coating, a heat sink H and a radiation fin F for satisfactorily absorbing heat generated during operation of the semiconductor element 3 and dissipating the heat into the air may be attached to the center of the underside of the insulating substrate 1; this allows long-term, normal and stable operation of the semiconductor element 3 at an appropriate temperature at all times. Accordingly, the capacitor-connecting pads 8a, 8b are preferably formed on the outer circumference of the underside of the insulating substrate 1 so as to allow attachment of the heat sink H and the radiation fin F to the underside of the insulating substrate 1.

The capacitor-connecting pads 8a, 8b are composed of a powder of a high-melting point metal such as tungsten, molybdenum or manganese in cases where the insulating substrate 1 is composed of sintered aluminum oxide, sintered aluminum nitride, sintered mullite or sintered silicon carbide, whereas they are composed of a powder of a relatively low-melting point metal such as copper, silver or gold when the insulating substrate 1 is composed of glass ceramic; in cases where they are composed of tungsten, for example, an appropriate organic binder and a solvent are added to tungsten powder, and mixed to prepare tungsten paste which is then print-coated on the green ceramic sheets to be processed into the insulating substrate 1 in a predetermined pattern by the well-known, conventional screen printing method, and then fired together with a laminate of the green ceramic sheets for preparation of the insulating substrate 1 so that the capacitor-connecting pads 8a, 8b are formed by coating on the outer periphery of the underside of the insulating substrate 1.

The insulating substrate 1 also has a pair of the ground plane 10 and the power-supply plane 11 placed close to and opposing each other, and sandwiching part of the insulating layers which form the insulating substrate 1, buried therein; electrical connections between the ground plane 10 and the ground bonding pad 5a via the connecting conductor 12a, and between the power-supply plane 11 and the power-supply bonding pad 5b via the connecting conductor 12b are established at the periphery of the mounting portion 1a of the insulating substrate 1, respectively, while electrical connections between the ground plane 10 and the capacitor-connecting pad 8a via the connecting conductor 12c, and between the power-supply plane 11 and the capacitor-connecting pad 8b via the connecting conductor 12d are established at the outer periphery of the insulating substrate 1.

The ground plane 10 and the power-supply plane 11, which function as conducting paths to electrically connect the respective electrodes of the chip capacitor 9 to the ground bonding pad 5a and the power-supply bonding pad 5b, have high mutual inductances when they are placed close to and opposing each other, and sandwiching part of the insulating layers which form the insulating substrate 1; as a result, the ground plane 10 and the power-supply plane 11 have small inductances (the relationship: L=L1+L2−2M holds when the inductances of the ground plane 10 and the power-supply plane 11 are represented by L, the self-inductance of the ground plane 10 by L1, the self-inductance of the power-supply plane 11 by L2, and the mutual inductance of the ground plane 10 and the power-supply plane 11 by M), and the capacitor-connecting pads 8a, 8b may be connected to the ground bonding pad 5a and the power-supply bonding pad 5b with small inductances even in cases of large horizontal distances of the capacitor-connecting pads 8a, 8b from the ground bonding pad 5a and the power-supply bonding pad 5b, thus allowing normal operation of the semiconductor element 3 without preventing reduction in power-supply noise by the chip capacitor 9.

In cases where the insulating substrate 1 is composed of sintered aluminum oxide, it is difficult to make the inductances of the ground plane 10 and the power-supply plane 11 extra small when the spacing between the ground plane 10 and the power-supply plane 11 is over 0.1 mm. Accordingly, the spacing between the ground plane 10 and the power-supply plane 11 is preferred to be 0.1 mm or less in cases where the insulating substrate 1 is composed of sintered aluminum oxide.

The ground plane 10 and the power-supply plane 11 are composed of a powder of a high-melting point metal such as tungsten, molybdenum or manganese in cases where the insulating substrate 1 is composed of sintered aluminum oxide, sintered aluminum nitride, sintered mullite or sintered silicon carbide, whereas they are composed of a powder of a relatively low-melting point metal such as copper, silver or gold when the insulating substrate 1 is composed of glass ceramic; in cases where they are composed of tungsten, for example, an appropriate organic binder and a solvent are added to tungsten powder, and mixed to prepare tungsten paste which is then print-coated on the green ceramic sheets to be processed into the insulating substrate 1 in a predetermined pattern by the well-known, conventional screen printing method, and then fired together with a laminate of the green ceramic sheets for preparation of the insulating substrate 1 so that the ground plane 10 and the power-supply plane 11 are buried in the insulating substrate 1, close to and opposing each other, and sandwiching part of the insulating layers which form the insulating substrate 1.

The insulating substrate 1 is designed in such a manner that the connecting conductors 12a, 12b for electrically connecting the ground bonding pad 5a and the power-supply bonding pad 5b to the ground plane 10 and the power-supply plane 11 are provided at the periphery of the semiconductor device-mounting portion 1a, and the connecting conductors 12c, 12d for electrically connecting the ground plane 11 and the power-supply plane 11 to the capacitor-connecting pads 8a, 8b are provided at the outer periphery of the insulating substrate 1, with all the four conductors 12a through 12d vertically penetrating the insulating layers which form the insulating substrate 1; the connecting conductors 12a through 12d electrically connect the ground bonding pad 5a and the power-supply bonding pad 5b to the ground plane 10 and the power-supply bonding pad 11, and the ground plane 10 and the power-supply plane 11 to the capacitor-connecting pads 8a, 8b, respectively.

Since the connecting conductors 12a, 12b electrically connect the ground bonding pad 5a and the power-supply bonding pad 5b to the ground plane 10 and the power-supply plane 11 at the periphery of the semiconductor element-mounting section 1a of the insulating substrate 1, and the connecting conductors 12c, 12d electrically connect the ground plane 10 and the power-supply plane 11 to the capacitor-connecting pads 8a, 8b at the outer periphery of the insulating substrate 1, the electric paths from the ground bonding pad 5a and the power-supply bonding pad 5b to the capacitor-connecting pads 8a, 8b via the connecting conductors 12a, 12b, the ground plane 10, the power-supply plane 11 and the connecting conductors 12c, 12d consist almost entirely of paths with small inductances via the ground plane 10 and the power-supply plane 11 in a horizontal direction, and accordingly, the connections of the capacitor-connecting pads 8a, 8b with the ground bonding pad 5a and the power-supply bonding pad 5b may be established with small inductances even when the capacitor-connecting pads 8a, 8b are situated at large horizontal distances from the ground bonding pad 5a and the power-supply bonding pad 5b. As a consequence, the function of the chip capacitor as a decoupling capacitor to reduce power-supply noise is not notably impaired.

The connecting conductors 12a through 12d are composed of a powder of a high-melting point metal such as tungsten, molybdenum or manganese in cases where the insulating substrate 1 is composed of sintered aluminum oxide, sintered aluminum nitride, sintered mullite or sintered silicon carbide, whereas they are composed of a powder of a relatively low-melting point metal such as copper, silver or gold when the insulating substrate 1 is composed of glass ceramic; in cases where they are composed of tungsten, for example, an appropriate organic binder and a solvent are added to tungsten powder, and mixed to prepare tungsten paste which is then print-coated on the green ceramic sheets to be processed into the insulating substrate 1 in a predetermined pattern by the well-known, conventional screen printing method, and then fired together with a laminate of the green ceramic sheets for preparation of the insulating substrate 1 so that the connecting conductors 12a through 12d are provided, vertically penetrating the insulating layers which form the insulating substrate 1.

As described above, with the semiconductor element-housing package according to the invention, the chip capacitor 9 is bonded to the capacitor-connecting pads 8a, 8b of the insulating substrate 1 via a conductive bonding material such as solder so as to electrically connect the respective electrodes of the chip capacitor 9 to the capacitor-connecting pads 8a, 8b while securely bonding the semiconductor element 3 to the semiconductor element-mounting portion 1a via an adhesive, and then the respective electrodes (ground electrode, power-supply electrode and signal electrode) of the semiconductor element 3 are electrically connected to the respective counterpart bonding pads (ground bonding pad 5a, power-supply bonding pad 5b and signal bonding pad) via the bonding wires 6 while bonding the lid 2 to the top surface of the insulating substrate 1 via a sealing material, and thus the semiconductor element 3 is hermetically housed in a container constructed of the insulating substrate 1 and the lid 2, and the chip capacitor 9 is situated as a decoupling capacitor between the ground electrode and the power-supply electrode of the semiconductor element 3 to establish a connection between them.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

What is claimed is:

1. A package for housing a semiconductor element, the package comprising:

an insulating substrate comprising a plurality of laminated insulating layers and having a semiconductor element-mounting portion in the center of a top surface thereof;

a ground bonding pad and a power-supply bonding pad formed on the top surface of the insulating substrate, at the periphery of the semiconductor element-mounting portion, to which a ground electrode and a power-supply electrode of the semiconductor element are connected;

a pair of capacitor-connecting pads formed on the insulating substrate, one of which is connected to the ground bonding pad, the other of which is connected to the power-supply bonding pad, and to both of which electrodes of a chip capacitor are connected; and a ground plane and a power-supply plane sandwiching at least one of the insulating layers buried opposing each other within the insulating substrate, each of the ground plane and the power-supply plane being electrically connected to the ground bonding pad and the power supply bonding pad, respectively at the periphery of the semiconductor element-mounting portion of the insulating substrate, wherein the capacitor-connecting pad connected to the ground bonding pad is connected to the around bonding pad through the ground plane, and the capacitor-connecting pad connected to the power-supply bonding pad is connected to the power-supply bonding pad through the power-supply plane.

2. The package according to claim 1, wherein the pair of capacitor-connecting pads are formed in the outer circumference of the underside of the insulating substrate.

3. The package according to claim 1, wherein the insulating substrate comprises sintered aluminum oxide, and the spacing between the ground plane and the power-supply plane is 0.1 mm or less.

4. The package of claim 1 wherein the insulating substrate comprises at least one of sintered aluminum oxide, sintered aluminum nitride, sintered mullite, sintered silicon carbide and glass ceramic.

5. The package of claim 4 wherein the insulating substrate comprises at least one of sintered aluminum oxide, sintered aluminum nitride, sintered mullite and sintered silicon carbide and further comprising a plurality of metallized wiring layers comprising a relatively high-melting point metal powder comprising at least one of tungsten, molybdenum and manganese.

6. The package of claim 4 wherein the insulating substrate comprises glass ceramic and further comprising a plurality of metallized wiring layers comprising a relatively low-melting point metal comprising at least one of copper, silver and gold.

7. The package of claim 4 wherein the insulating substrate comprises at least one of sintered aluminum oxide, sintered aluminum nitride, sintered mullite and sintered silicon carbide and wherein the ground plane and the power-supply plane comprise a relatively high-melting point metal powder comprising at least one of tungsten, molybdenum and manganese.

8. The package of claim 4 wherein the insulating substrate comprises glass ceramic and wherein the ground plane comprises a relatively low-melting point metal comprising at least one of copper, silver and gold.

9. The package of claim 5 wherein at least one of the plurality of metallized wiring layers and the ground plane comprise tungsten.

10. The package of claim 1 wherein the insulating material is selected from the group consisting of sintered aluminum oxide, sintered aluminum nitride, sintered mullite, sintered silicon carbide and glass ceramic.

11. A package for housing a semiconductor element, the package comprising:

an insulating substrate comprising a plurality of laminated insulating layers and having a semiconductor element-mounting portion centered in a top surface thereof;

a ground bonding pad and a power-supply bonding pad formed on the insulating substrate and at the periphery of the semiconductor element-mounting portion, the ground bonding pad and the power-supply bonding pad provided for connecting to a ground electrode and a power-supply electrode of a semiconductor element;

a ground plane and a power-supply plane sandwiching at least one of the insulating layers buried within the insulating substrate so that the ground plane, the at least one insulating layer, and the power-supply plane form a first capacitor connected across the ground bonding pad and the power supply bonding pad, the ground plane and the power-supply plane connected to the ground bonding pad and the power supply bonding pad, respectively, at the periphery of the semiconductor element-mounting portion of the insulating substrate;

first and second capacitor-connecting pads formed on the insulating substrate, the first capacitor-connecting pad connected to the ground bonding pad through the ground plane, the second capacitor-connecting pad connected to the power-supply bonding pad through the power-supply plane; and a chip capacitor connected to the first and second capacitor-connecting pads to provide a second capacitor in parallel with the first capacitor.

12. The package of claim 11 wherein the semiconductor element-mounting portion is formed within a recessed area of the insulating substrate.

13. The package of claim 11 wherein a capacitance of the second capacitor is higher than a capacitance of the first capacitor.

* * * * *